(12) United States Patent
Schwertner et al.

(10) Patent No.: US 10,917,031 B2
(45) Date of Patent: Feb. 9, 2021

(54) MODULAR TILE, A FUNCTIONALIZED BATTEN, A PIPE AND A METHOD FOR PRODUCING A PIPE

(71) Applicant: LOGIC SWISS AG, Hergiswil (CH)

(72) Inventors: Heiko Schwertner, Ebikon (CH); Romeo Maggi, Hergiswil (CH)

(73) Assignee: LOGIC SWISS AG, Hergiswil (CH)

( * ) Notice: Subject to any disclaimer, the term of this patent is extended or adjusted under 35 U.S.C. 154(b) by 0 days.

(21) Appl. No.: 16/349,027

(22) PCT Filed: Nov. 11, 2016

(86) PCT No.: PCT/EP2016/077486
§ 371 (c)(1),
(2) Date: May 10, 2019

(87) PCT Pub. No.: WO2018/086708
PCT Pub. Date: May 17, 2018

(65) Prior Publication Data
US 2019/0288635 A1    Sep. 19, 2019

(51) Int. Cl.
*H02S 10/12*    (2014.01)
*H02S 20/25*    (2014.01)
(Continued)

(52) U.S. Cl.
CPC .............. *H02S 10/12* (2014.12); *E04D 1/24* (2013.01); *E04D 1/30* (2013.01); *E04D 12/004* (2013.01);
(Continued)

(58) Field of Classification Search
CPC .......... H02S 10/12; H02S 20/26; H02S 20/25; H02S 40/34; H02S 40/44; F03D 9/34; F03D 9/45; F03D 9/007; F03D 1/00; F24S 10/95; F24S 20/69; E04D 1/24; E04D 1/30; E04D 12/004; E04D 13/17; E04D 2001/309;
(Continued)

(56) References Cited

U.S. PATENT DOCUMENTS 8,201,382 B1    6/2012   Pao
8,281,523 B2 *  10/2012  De Nardis ................ E04D 1/28
                                                     52/173.3

(Continued)

FOREIGN PATENT DOCUMENTS

DE    10 2004 001 875 A1    8/2005
DE    20 2008 014 689 U1    3/2009
(Continued)

OTHER PUBLICATIONS

International Search Report Corresponding to PCT/EP2016/077486 dated Jun. 7, 2017.
(Continued)

*Primary Examiner* — Joshua K Ihezie
(74) *Attorney, Agent, or Firm* — Davis & Bujold PLLC; Michael J. Bujold

(57) ABSTRACT

A tile, preferably a roof tile (1), for collecting energy from kinetic, thermal and light sources. The tile comprises a housing (2) with at least one photovoltaic cell (3) for collecting energy from a light source and at least one thermal collector (4). The tile comprises at least one wind channel (5) with a wind turbine (6).

20 Claims, 11 Drawing Sheets

(51) Int. Cl.

| | |
|---|---|
| *H02S 40/34* | (2014.01) |
| *H02S 40/44* | (2014.01) |
| *F03D 9/45* | (2016.01) |
| *F24S 10/95* | (2018.01) |
| *F24S 20/69* | (2018.01) |
| *E04D 1/24* | (2006.01) |
| *E04D 1/30* | (2006.01) |
| *E04D 12/00* | (2006.01) |
| *E04D 13/17* | (2006.01) |
| *F03D 9/00* | (2016.01) |
| *F25B 21/04* | (2006.01) |
| *H01L 35/30* | (2006.01) |
| *F03D 9/34* | (2016.01) |
| *H02S 20/26* | (2014.01) |
| *C25B 1/00* | (2006.01) |
| *C25B 1/02* | (2006.01) |
| *F03D 1/00* | (2006.01) |

(52) U.S. Cl.
CPC .............. *E04D 13/17* (2013.01); *F03D 9/007* (2013.01); *F03D 9/34* (2016.05); *F03D 9/45* (2016.05); *F24S 10/95* (2018.05); *F24S 20/69* (2018.05); *F25B 21/04* (2013.01); *H01L 35/30* (2013.01); *H02S 20/25* (2014.12); *H02S 20/26* (2014.12); *H02S 40/34* (2014.12); *H02S 40/44* (2014.12); *C25B 1/003* (2013.01); *C25B 1/02* (2013.01); *E04D 2001/309* (2013.01); *F03D 1/00* (2013.01); *F05B 2240/9111* (2013.01); *F05B 2240/9112* (2013.01); *Y02B 10/10* (2013.01); *Y02B 10/20* (2013.01); *Y02B 10/30* (2013.01); *Y02B 10/70* (2013.01); *Y02E 10/44* (2013.01); *Y02E 10/728* (2013.01)

(58) Field of Classification Search
CPC .. F25B 21/04; H01L 35/30; F05B 2240/9112; F05B 2240/9111; Y02B 10/30; Y02B 10/20; Y02B 10/10; Y02B 10/70; Y02E 10/728; Y02E 10/44; C25B 1/003; C25B 1/02
See application file for complete search history.

(56) References Cited

U.S. PATENT DOCUMENTS

| | | | |
|---|---|---|---|
| 9,422,922 B2 * | 8/2016 | Sant'Anselmo | F03D 13/40 |
| 2008/0135092 A1 | 6/2008 | Corrales | |
| 2008/0315592 A1 * | 12/2008 | Branco | F03D 9/45 290/55 |
| 2009/0223550 A1 * | 9/2009 | Curtin | H02S 20/25 136/244 |
| 2009/0308020 A1 * | 12/2009 | Duke | E04D 3/30 52/745.2 |
| 2010/0068030 A1 * | 3/2010 | Nightingale | F03D 1/04 415/60 |
| 2010/0147347 A1 | 6/2010 | Dyreby et al. | |
| 2010/0275532 A1 * | 11/2010 | De Nardis | H02S 40/44 52/173.3 |
| 2011/0049992 A1 * | 3/2011 | Sant'Anselmo | H02S 10/10 307/64 |
| 2014/0261634 A1 * | 9/2014 | Rubio | F24S 40/80 136/248 |
| 2015/0349178 A1 * | 12/2015 | Rubio | H02S 20/00 136/248 |
| 2017/0237390 A1 * | 8/2017 | Hudson | E04D 3/30 136/251 |

FOREIGN PATENT DOCUMENTS

| | | |
|---|---|---|
| DE | 10 2009 012 520 A1 | 9/2010 |
| DE | 10 2011 105 965 A1 | 1/2013 |
| EP | 2 048 452 A1 | 4/2009 |
| EP | 2 098 804 A2 | 9/2009 |
| FR | 3 004 741 A1 | 10/2014 |
| JP | H08-100503 A | 4/1996 |
| JP | 2003-065206 A | 3/2003 |
| JP | 2003-074989 A | 3/2003 |
| JP | 2012-036414 A | 2/2012 |
| WO | 2009/081439 A2 | 7/2009 |

OTHER PUBLICATIONS

Written Opinion Corresponding to PCT/EP2016/077486 dated Jun. 7, 2017.
Japanese Office Action Corresponding to 2019-546971 dated Aug. 18, 2020.

* cited by examiner

MODULAR TILE, A FUNCTIONALIZED BATTEN, A PIPE AND A METHOD FOR PRODUCING A PIPE

FIELD OF THE INVENTION

The present invention relates to a tile, a batten, a pipe and a method for producing a pipe according to the preamble of the independent claims.

BACKGROUND OF THE INVENTION

The present invention relates to the field of the collection of renewable energy. Collecting energy from the environment is one possibility to reduce the need for fossil fuels and nuclear energy. The most commonly applied systems are windmills for the production of electric power from wind energy, heat exchangers to harvest thermal energy and photovoltaic cells to collect electric energy from the sunlight.

DE 10 2009 012 520 A1 and DE 20 2008 014 689 U disclose wind turbines that are placed on masts or on the highest point of roof ridges. Due to legal restrictions in housing construction, these kinds of windmills are rarely built. Apart from that, this kind of construction is not accepted by customers from an architectural point of view.

WO 2009/081439 A discloses a solar collector module for the formation of a thermic or photovoltaic roof. The solar collector has the disadvantage that it is the dependent on the weather conditions. If the weather is cloudy, the energy output is reduced. Another disadvantage is the need of considerable area for photovoltaic cells and thermal collectors, since both are placed next to each other.

DE 10 2011 105 965 A1 discloses a roofing system consisting of box-shaped roofing modules. The module comprises a hollow space for air currents. In one embodiment the module comprises a photovoltaic layer or cell.

DE 10 2004 001 975 A1 discloses an insulated modular roof system comprising a prefabricated roof module which includes at least one flow channel for a fluid medium and supporting structures. In one embodiment photovoltaic solar cells or modules are adhered to an outer shell via removable adhesive strips.

SUMMARY OF THE INVENTION

The object of the present invention is to overcome the disadvantages of the prior art.

According to one aspect of the invention the problems are solved with a tile, a batten, a pipe and a method for producing a pipe according to the independent claims and the characterizing features.

It is suggested to provide a tile, preferably a roof tile, for collecting energy from kinetic, thermal and light sources. The tile comprises a housing with at least one photovoltaic cell for collecting energy from a light source and at least one thermal collector. The tile comprises at least one wind channel with a wind turbine.

A tile as used herein is understood as a unit which covers and protects a surface or a building, preferably roofs or walls of a building.

The wind turbine has the advantage of providing energy when the sun radiation is low. Thus, the tile can provide energy, e.g. electric energy, more consistently and reliably.

In a preferred embodiment the tile includes a nontransparent bottom sheet. In a preferred embodiment the tile does not include a bottom sheet. In a preferred embodiment the tile has a length between 10 mm and 3000 mmm. In a preferred embodiment the tile is connectable to a batten. In a preferred embodiment the tile has an oval shape. In a preferred embodiment the tile consists of a tube. In a preferred embodiment the tiles are stackable, particularly preferred with a space in between the tiles. In a preferred embodiment the wind channel is at least partially formed by an insert within the housing. In a preferred embodiment the module can be folded from an inside to an outside. Thereby a roof may be vented. In a preferred embodiment the photovoltaic cell comprises a semiconductor.

In a preferred embodiment the wind turbine is provided at a side, which points away from the sunlight, of the photovoltaic cells and/or thermal collectors during intended use.

Thereby, incoming sunlight can be used efficiently, since sun-exposed surface is not used by the wind turbine.

In a preferred embodiment the wind channel includes at least one inlet and at least one outlet. An inlet cross-sectional area and an outlet cross-sectional area are larger than a cross-sectional area of the wind channel in between inlet and outlet.

Thus a wind speed in the channel is increased towards the smaller cross-section and higher energy conversion efficiency by the wind turbine may be achieved. Particularly preferred the wind turbine is placed in the smallest cross section of the wind channel.

In a preferred embodiment the inlet and/or outlet includes a mesh.

The mesh protects the wind turbine from objects like leaves which could occlude the wind channel or block the wind turbine.

In a preferred embodiment a tile comprises a concave surface, which is particularly preferred parabolic. The concave surface is particularly preferred at least partially formed by the at least one photovoltaic cell.

Due to the concave surface sunlight can be reflected in one particular spot or line, i.e. towards the at least one thermal collector. Thus an energy output of a thermal collector is increased.

In a preferred embodiment the housing comprises a concave plate limiting the wind channel.

Thereby, the concave surface and the smaller cross-sectional area in the wind channel can be realized in a particularly simple fashion. The at least one photovoltaic cell can be attached to the concave plate. The concave plate is particularly preferred parabolic In a preferred embodiment the concave surface comprises a bottom extending in the direction of the channel or orthogonal to the direction of the wind channel.

A channel allows the direction of the incoming light towards a tube-shaped thermal collector such as a heat pipe.

Particularly preferred, the bottom extends along a direction of the thermal collector.

In a preferred embodiment the tile comprises a transparent cover sheet covering at least partially spaced the concave surface. The cover sheet is particularly preferred at least partially made of noise insulating material. One particularly preferred material is plastic. Particularly preferred the noise insulating material is selected from a list comprising glass, polycarbonates, poly methyl methacrylate (PMMA), polycycloolefin (Zeonex), polyamide, polyetherimide and polystyrene The cover sheet provides protection of the at least one photovoltaic cell against environmental influences like rain or hail.

In a preferred embodiment the cover sheet extends beyond the wind channel on a side of an inlet of the wind channel.

Thereby, the cover sheet protects the inlet. Thus, items like leaves are prevented from entering the inlet.

In a preferred embodiment the wind turbine includes rotor blades or is a bladeless turbine or a tesla turbine or a wave generator or a combination thereof.

A bladeless turbine may comprise lamellas and may generate power with a hydraulic system.

In a particularly preferred embodiment the wind turbine includes an electric generator. The electric generator may be placed in a hub the wind turbine. The electric generator alternatively may comprise permanent magnets on the tip of wind turbine blades which move through coils which are placed around the wind turbine.

In a preferred embodiment a closed space is formed in between the transparent cover sheet and the concave surface. Optionally the housing also forms the closed space.

A closed space is herein understood as a space which is closed such that an exchange of a fluid, i.e. air, between the closed space and an exterior is inhibited. The closed space may comprise an inlet and/or an outlet.

Thereby, the closed space heats up when the transparent cover sheet is exposed to light, e.g. sunlight. As a result the closed space provides a suitable location for the at least one thermal collector.

In a preferred embodiment the at least one thermal collector includes a pipe or a thermoelectric or a thermal storage element or a combination thereof.

In a particular preferred embodiment the thermal collector comprises at least one, preferably only one, heat pipe. A heat pipe is a particularly simple and cost efficient realization of a thermal collector.

The thermoelectric element comprises preferably a Peltier element.

In a preferred embodiment the heat pipe is placed in the closed space.

The heat pipe is particularly efficient when placed within the closed space.

In a preferred embodiment the at least one thermal collector is placed between the at least one photovoltaic cell and the at least one wind channel or within the at least one wind channel.

Thereby, the thermal collector can regulate a temperature of the at least one photovoltaic cell.

Particularly preferred, the thermal collector additionally includes a heat conducting plate.

In a preferred embodiment the tile comprises a thermoelectric generator layer adjacent to the at least one photovoltaic cell.

The thermoelectric generator layer preferably includes a Peltier element.

Thereby, the energy output of the tile is increased further. Optionally the thermoelectric generator layer cools the at least one photovoltaic cell.

In a preferred embodiment a surface of the wind channel is structured such that an incoming air stream is transformed into a vortex stream.

Thereby, the kinetic energy of the wind can be converted more efficiently into mechanical energy by the wind turbine.

In a preferred embodiment the air stream is directed with one or more flaps and/or one or more valves.

Particularly preferred the flaps or valves are actuated by a bimetal or a motor controlled by the control unit. Alternately the flaps are actuated by a material which expands upon temperature increases. Thereby, the air stream is preferably directed towards the turbine.

In a preferred embodiment the tile includes at least one sensor.

In a particularly preferred embodiment the at least one sensor is adapted to measure a condition selected from a first group comprising: humidity, temperature, wind velocity, light intensity and air pressure.

In a particularly preferred embodiment the tile includes at least two sensors where one sensor is adapted to measure a condition selected from the first group. The other sensor measures another condition selected from the first group.

In a preferred embodiment the at least one sensor is adapted to measure a parameter selected from a second group comprising: energy output, rotation of the wind turbine, heat transfer and the temperature of the tile.

In a particularly preferred embodiment the tile comprises at least two sensors adapted to measure a parameter selected from one of the groups.

One sensor may measure a first parameters selected from the one of the groups, while the second sensor measures another parameter from the groups. Optionally third and fourth sensors may measure a parameters selected from the groups.

Thereby, the functioning of the device may be monitored.

In preferred embodiment the tile includes a cooling element. Preferably the cooling element is an active cooling element.

An active cooling element is herein understood as a cooling element which needs a power supply.

Thereby, the at least one photovoltaic cell may be cooled.

In a particularly preferred embodiment the active cooling element is at least one of a group comprising a Peltier element, a magnetic cooling element and micro compressor.

In a preferred embodiment the housing is at least partially made of a noise insulating material. The noise insulating material is preferably plastic.

Thereby, noise, e.g. noise from the wind turbine(s), may be insulated from the surrounding, e.g. a house.

In a preferred embodiment the tile comprises at least one bottom sheet. The bottom sheet is preferably at least partially made of noise insulating material. The noise insulating material is particularly preferred plastic.

In one embodiment the bottom sheet limits the wind channel.

Thereby, a particularly simple construction of the wind channel needing few parts is made possible. The bottom is transparent in a particularly preferred embodiment.

In a preferred embodiment the tile includes a mechanic connector (21) for a mechanic connection to another tile.

In a preferred embodiment components of the tile are connected by a mechanical connector.

Examples for a mechanic connector are a screw, a nail or a binder.

Thereby, a tile may be connected to another tile and thus fixated.

Preferably the tiles are connectable such that a closed surface is formed.

Thereby, a closed surface can be formed such that a building may be protected.

In a preferred embodiment the tile comprises a bottom sheet or a base plate including a latching element.

Thereby, a tile may be connected to another tile in particularly simple fashion, i.e. without the need any further tools or parts.

In a preferred embodiment the tile includes an electric and/or thermal and/or fluid connector.

Thereby, the tile may be connected electrically and/or thermally and/or fluidly with a building or another tile.

In particular the tile may be connected or connectable to an in-house electrical network and/or a heating of a house and/or sensors in the house.

In a particularly preferred embodiment at least one of the connectors is connectable to another tile.

Thereby, a time to assemble a roof may be shortened.

In a preferred embodiment the tile comprises a motor for actuating the wind turbine to induce an air stream.

Thereby, the air stream can be reversed to flow from the outlet to inlet. Thus, occlusions or obstacles in the wind channel may be eliminated.

In a preferred embodiment the tile comprises an actuator.

The actuator allows movement the photovoltaic cell in order to optimize the energy output. Additionally or alternatively the actuator may displace the cover sheet allowing air circulation between a space in between cover sheet and concave surface. The air circulation then cools the photovoltaic cells.

Particularly preferred, the actuator can rotate the tile in order to adjust a tile position to the position to a position of the sun. The actuator may be actively controlled, e.g. an electrical motor with a power source or activated by external conditions, e.g. materials which expand when exposed to heat.

In a particularly preferred embodiment the actuator moves the at least one photovoltaic cell and/or blades of the wind turbine and/or the thermal collector.

Thereby, properties and/or a position of the at least one photovoltaic cell and/or the blades of the wind turbine and/or the thermal collector can be optimized according to the outer conditions.

In a preferred embodiment the tiles connectable to a control center, particularly preferred a building automation control center.

Thereby, the tiles can be remotely controlled, e.g. switched on or off and/or monitored and/or actuated.

In a preferred embodiment the thermal collector includes a thermoelectric element.

Thereby, the thermal energy may be directly transformed to electrical energy.

In a preferred embodiment the tile comprises an electrolysis unit.

Thereby, the tile may produce hydrogen as energy storage.

In a preferred embodiment the wind turbine and photovoltaic and thermal generator are usable independent of one another.

Thereby, if one of the units is damaged the other two may function.

In a preferred embodiment the tiles are installed on a roof or a wall or a shaft or a tower or a soil surface or on water or on sails or on a bendable surface, e.g. a sail or a canvas, or on an outer surface of a vehicle, e.g. a motor vehicle like a car, a train or a truck, or a ship.

According to another aspect of invention it is suggested to provide a building comprising a plurality of tiles. In a preferred embodiment the tiles are roofing tiles and may cover a roof of the building.

According to another aspect of the invention it is suggested to provide a batten for the fixation of tiles. The batten comprises a pipe for transporting water and a track for electric wiring. The electric wiring comprises at least one first interface allowing an electrical connection to a tile. The pipe comprises at least one second interface for a tile allowing a fluidic connection. The tile comprises a third mechanical interface allowing a fixation of a tile.

Thereby, an electrical as well as a fluidic connection can be provided for a tile by the batten, to which tile is also fixed to. All connection elements for a roof tile are provided in a single unit, which facilitates handling the batten and may accelerate the construction process.

In a preferred embodiment the batten includes a housing surrounding at least a longitudinal section of the pipe.

Thereby, the pipe is protected.

In a particularly preferred embodiment the batten completely surrounds the longitudinal section of the pipe.

In a preferred embodiment the housing is made of wood, particularly preferred a wood plastic composite. Alternatively the housing may be made of a metal or plastic.

Thereby, the housing provides the mechanical interface. The tiles can be nailed or screwed.

The preferred embodiment in the batten includes at least one longitudinally extending recess on an outer surface of the housing. The recess particularly preferred comprises the track for the electric wiring.

Thereby, the electric wiring is protected within the recess.

In a preferred embodiment the tile is releasably attachable to the batten with a latching element.

Thereby, a tile and a batten may be connected without the use of any further tools.

In a preferred embodiment at least one of the interfaces allows a removable connection.

Thereby, the electric wiring or the pipe connection may be removed in case of connection or in case a tile is removed from the batten.

According to another aspect of the invention it is suggested to provide a pipe for transporting a fluid. The pipe has a cross-section orthogonal to an intended flow direction of the fluid with a wall comprising a first deformable circumferential wall section and a second rigid circumferential wall section. The first deformable section is at least partially made of a thermally conductive material.

Thereby, a thermally conductive connection to the fluid within in the pipe may be formed through the second deformable wall section. The deformability allows a tight fit, which increases a thermal conductivity.

The deformable material wall section is preferably made of a polyamide, polybutylene terephthalate or liquid crystal polymer or polyphenylene sulfide. Particularly preferred the deformable wall section is made of PA6 or PA 12 or PA66.

In a preferred embodiment the second section extends towards center of the pipe forming a cavity. The cavity is formed by an outer edge of the second section.

Thereby, a thermally conducting surface area is increased.

In a preferred embodiment the cavity extends along the intended flow direction of the fluid in the pipe.

Thereby, a surface through which thermal energy is conducted is increased. Another possible advantage is a flexibility to insert a heat source at any location along the length of the cavity.

In a preferred embodiment the second section is adapted to receive a head of a heat pipe.

In a preferred embodiment the pipe includes a latching element for receiving and retaining a head of a heat pipe in the cavity.

Thereby, the head of a heat pipe may be retained without a need of any further tools.

In a preferred embodiment the first rigid part is C-shaped. This form can be produced economically.

In a preferred embodiment the pipe comprises nozzles which are directable to a roof.

In case of flying sparks or a fire in a building, the nozzles may spray the liquid, i.e. water, in the pipe.

In a preferred embodiment the first and second part of the wall are integrally formed. In a particularly preferred embodiment the first and second part are formed by two-component injection molding or coextrusion.

Thereby, the pipe can be produced cost-effectively.

In a preferred embodiment the pipe is electrically conductive and includes electrical interface. In a particularly preferred embodiment the rigid section is electrically conductive and includes an electrical interface.

Thereby, the pipe may be used as a lightning rod.

According to another aspect of the invention a system is provided. The system includes a pipe and nozzle which is directable to a roof.

Thereby, the system may be used to clean roof tiles and/or to extinguishing fires.

According to another aspect of the invention a method for producing pipes is provided. The method comprises the steps of providing a first deformable section and a second rigid section joining the first and the second section at a first edge and joining the first and the second section at a second edge.

BRIEF DESCRIPTION OF THE DRAWINGS

Non-limiting embodiments of the invention are described by way of example only, with respect to the accompanying drawings, in which.

DETAILED DESCRIPTION OF THE PREFERRED EMBODIMENTS

Figure 1:
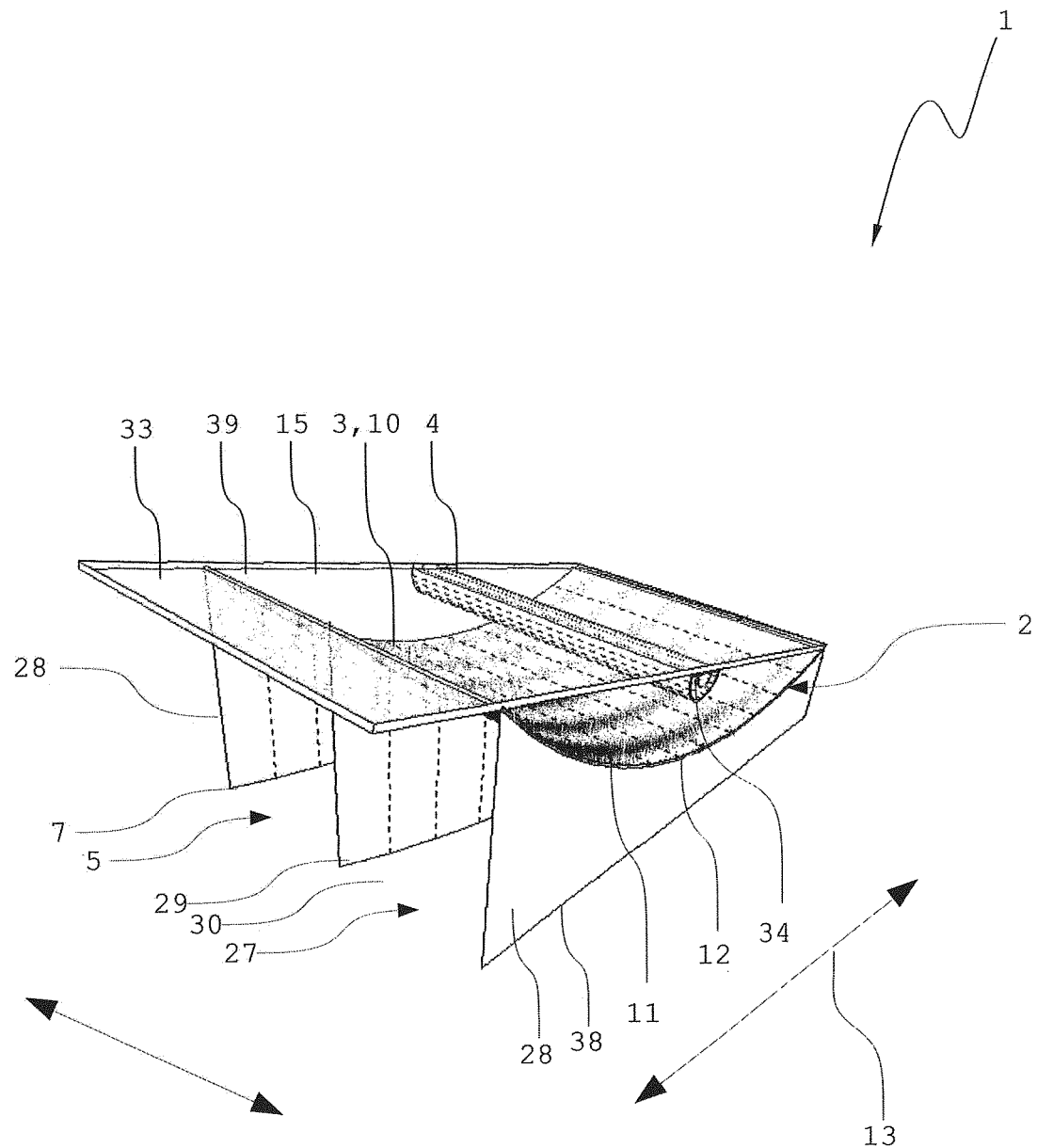
FIG. 1: is a perspective view of a part of a roof tile.

FIG. 1 shows a perspective view of a first embodiment of a tile. The tile shown in FIG. 1 is a roof tile 1. The roof tile 1 includes a housing 2. The housing 2 comprises two outer walls 28, an inner wall 29 and a concave plate 11. The concave plate 11 has a parabolic shape. At longitudinal ends of the concave plate 11 a cover sheet 15 is fixed. In between the cover sheet 15 and the concave plate 11 a space is formed. The roof tile 1 includes a bottom 38 and a top 39. Photovoltaic cells 3 are mounted on a top side of the concave plate 11. The photovoltaic cells 3 are mounted on the concave plate 11 such that reflected sunlight is reflected by a concave surface 10 formed by the photovoltaic cells 3 towards a thermal collector 4. The thermal collector 4 includes a heat pipe 34. The heat pipe 34 is surrounded by a semi-circular layer 40, which defines closed space including the heat pipe 34. The semi-circular layer 40 is made of a light absorbing material. Incoming light is reflected from the concave surface 10 and absorbed by thermal collector 4.

The inner wall 29 and outer walls 28 in combination with the concave plate 11 and a bottom sheet 24 (see FIG. 4) define a first wind channel 5 and a second wind channel 27. The first wind channel 5 includes a first inlet 7 and the second wind channel includes a second inlet 30. The inlets are protected by a mesh (not shown). Both channels extend in a longitudinal direction 13 of the roof tile 1.

The concave plate has a parabolic shape with a bottom 12. The bottom 12 extends along a direction orthogonal 14 to a direction of the wind channels 5, 27.

Further, the cover sheet 15 extends beyond the inlets 7, 30, of the wind channels 5, 27. Thus, the cover sheet 15 includes an overhang 33 protecting the inlets 7, 30.

Figure 2:
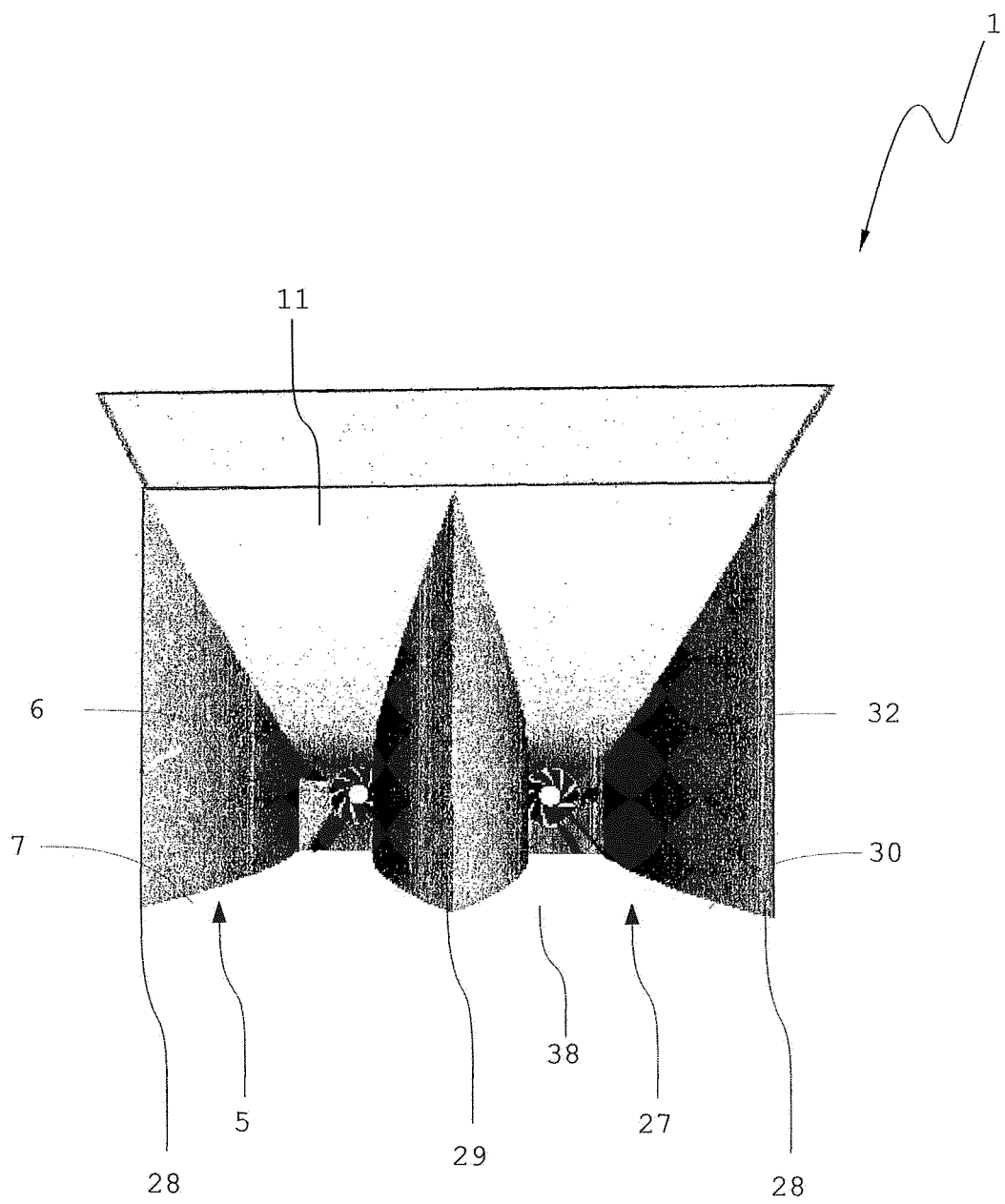
FIG. 2: is a front view of the part of the roof tile of FIG. 1,
FIG. 3: is a perspective view of a backside of the roof tile of FIG. 1,
FIG. 4: is a perspective view of an assembly of a roof tile.

FIG. 2 shows a front view of the roof tile 1 of FIG. 1. FIG. 2 displays a shape of the wind channels 5, 27. The cross sections of the channels are defined by the concave plate 11 and the inner and outer walls 28, 29. The walls 28 and 29 are bent towards a middle of each channel 5, 27. In addition the concave plate 11 extends in a direction towards the bottom side 38. Thus, a cross sectional area of the inlets 7, 30, decreases from the inlet in the direction of the wind channels 5, 27. Each wind channel includes the wind turbines 6, 32. The wind turbines 6, 32 are placed in the smallest cross section of the channels. Each wind turbine 6 includes rotor with blades, which are activated by wind blowing through the wind channels 5, 27.

Figure 3:
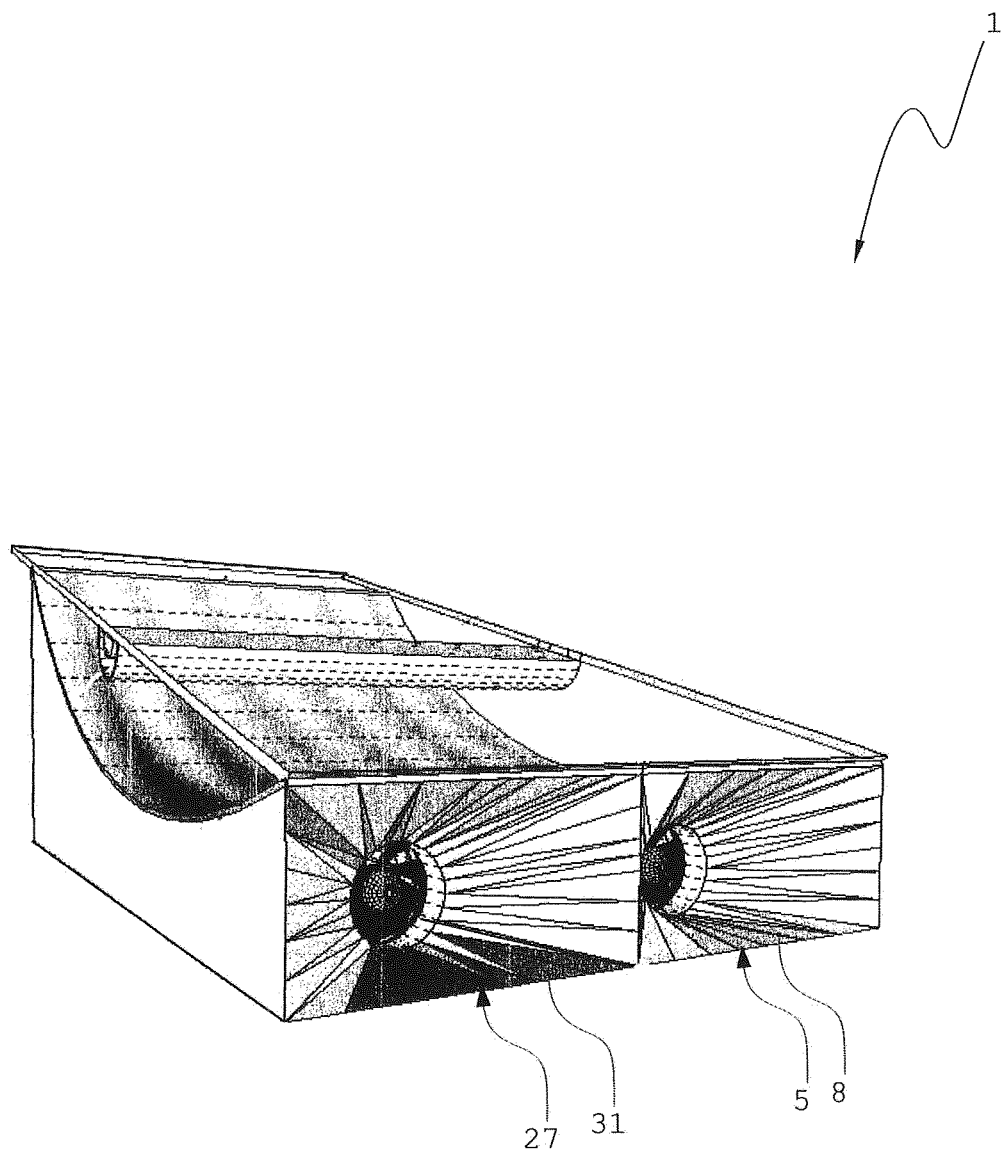

FIG. 3 shows a perspective view of a back side of roof tile 1. FIG. 3 shows a first outlet 8 of the first wind channel 5 and a second outlet 31 of the second wind channel 27. A cross sectional area of the wind channel in between inlets 7, 30 and the outlets 8, 31, where the wind turbine 6 is placed, is smaller than a cross sectional area of the outlets 8, 31.

Figure 4:
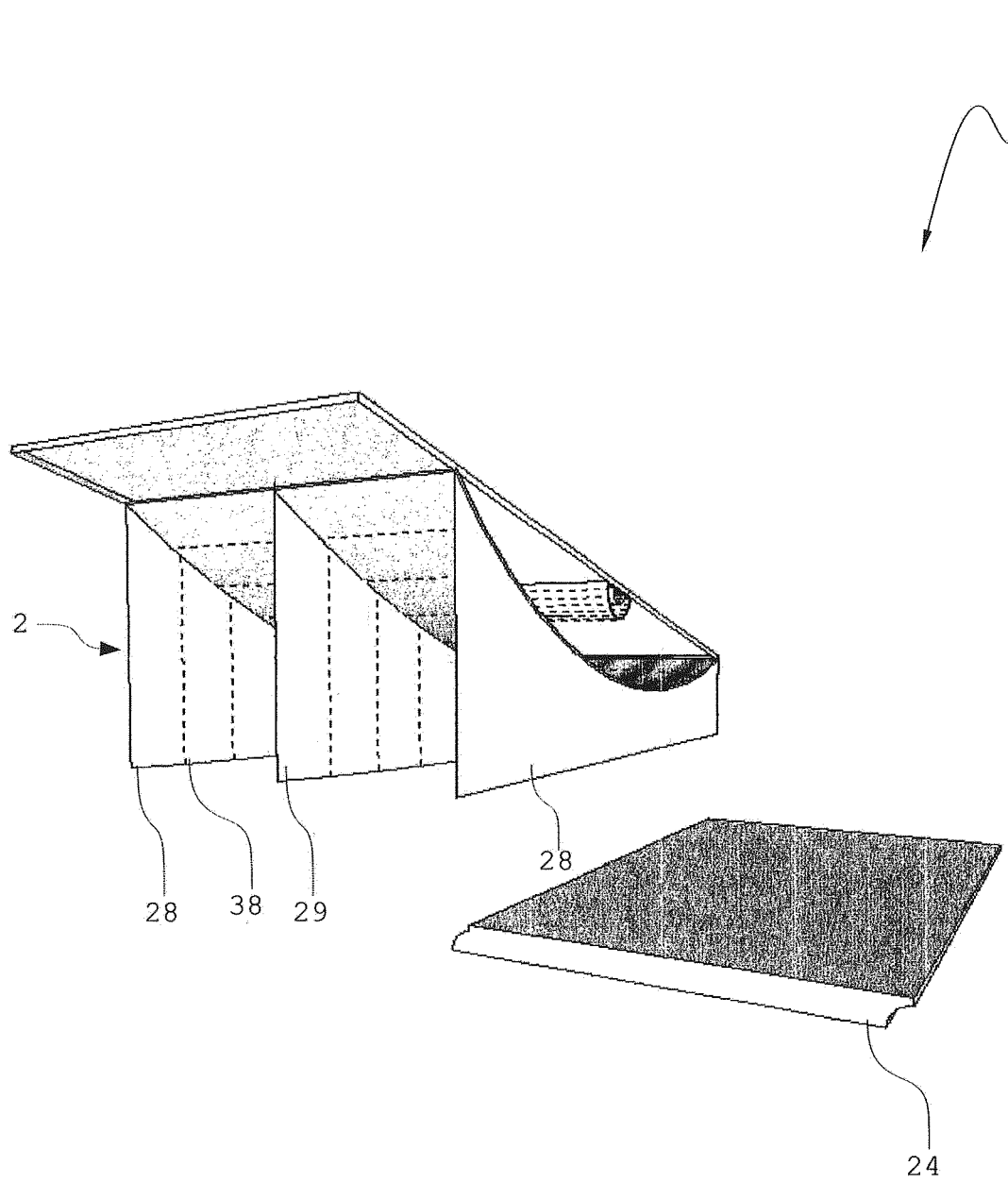

FIG. 4 is another perspective view of an of the roof tile 1. The roof tile 1 further includes a bottom sheet 24 (not shown in FIGS. 1-3). The bottom sheet 24 is attached to the inner and outer walls 28, 29. The bottom plate closes the wind channels 5, 27 on the bottom side 38 of the roof tile and is made of the same material as the housing 2.

Figure 5:
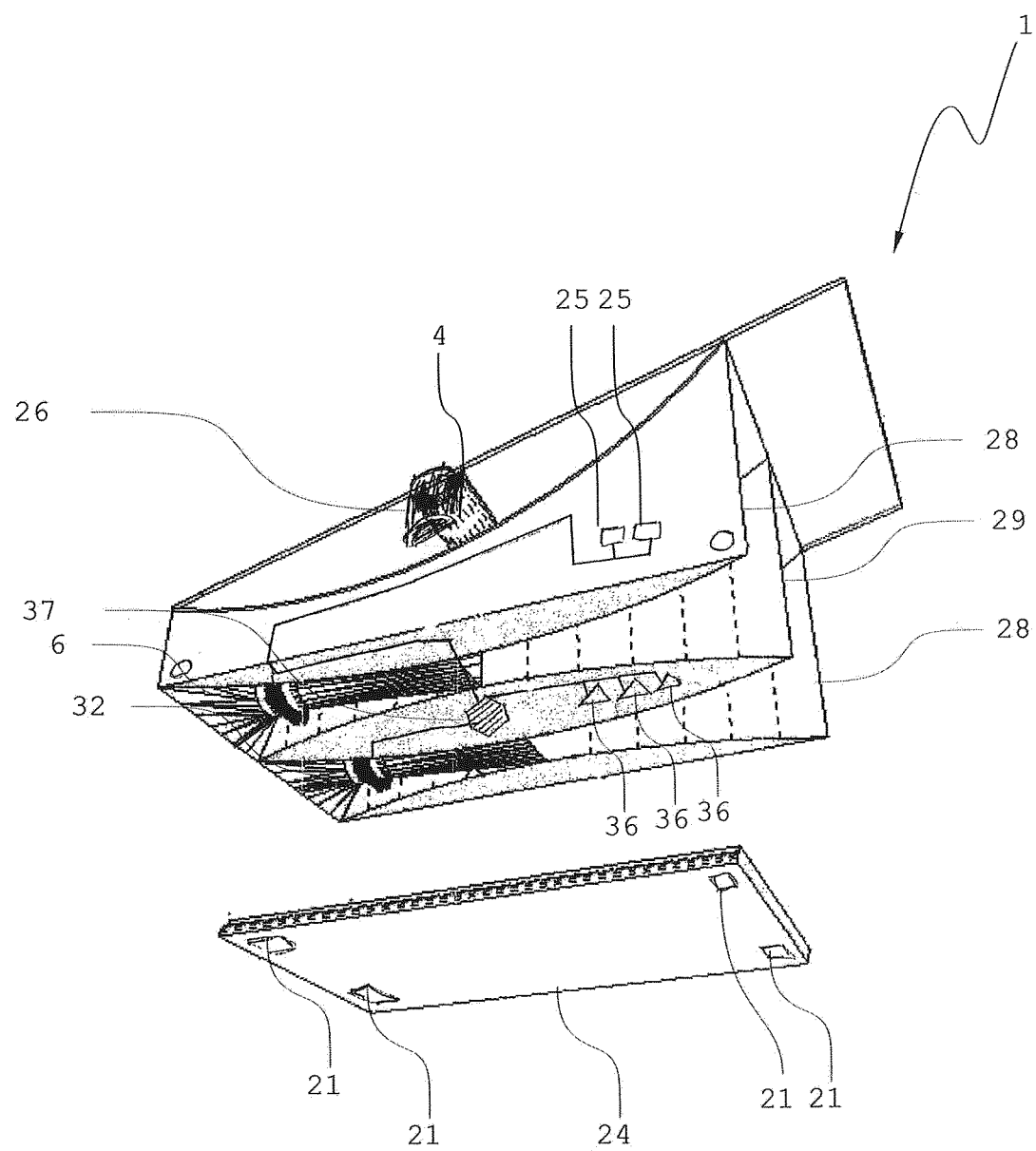
FIG. 5: is a bottom view of internal spaces for sensors, electronic controls and mechanical elements of the roof tile.

FIG. 5 shows the roof tile shown in the previous figures in greater detail. The outer walls 28 and the inner walls 29 each include a hollow space. Within the hollow spaces a control unit 37 and sensors 36 are located. A control unit 37 is placed within the inner wall 29. The control unit 37 controls a power output of the wind turbines 6, 32, thermal collector 4 and photovoltaic cells 3. Further, the control unit 37 is connected to sensors 36.

The sensors 36 measure a flow velocity an air stream through the wind channels 5 and 27, a temperature within housing 2, an incidence of light, i.e. an incident angle relative to the tile 1, an intensity of light, a rotational velocity of the rotor and an electric output current and voltage.

The control unit 37 further controls the rotors and communicates with a building control center by sending data which is collected by the sensors 36 to the building control center. In the building control center the data is evaluated. The data sent includes an identifier which is unique to each control unit.

Further the control unit communicates with the heating, water and power installation of the building.

The bottom sheet 24 includes four latching elements 21. With the latching elements 21 the roof tile is connected to a roof batten (see FIG. 10).

Further, the thermal collector 4 includes a fluid connector 26. The fluid connector 26 allows a fluid connection to a heat pipe of a neighbouring tile. The roof tile is also electrically connected to a neighbouring tile by electric connectors 25. The electric connectors 25 transfer a generated power to the next tile or an in-house electrical network. An electric generator (not shown) is also placed in the hub of the wind turbines 6, 32. The electric generator converts the mechanical energy of the wind turbines into electrical energy.

Figure 6:
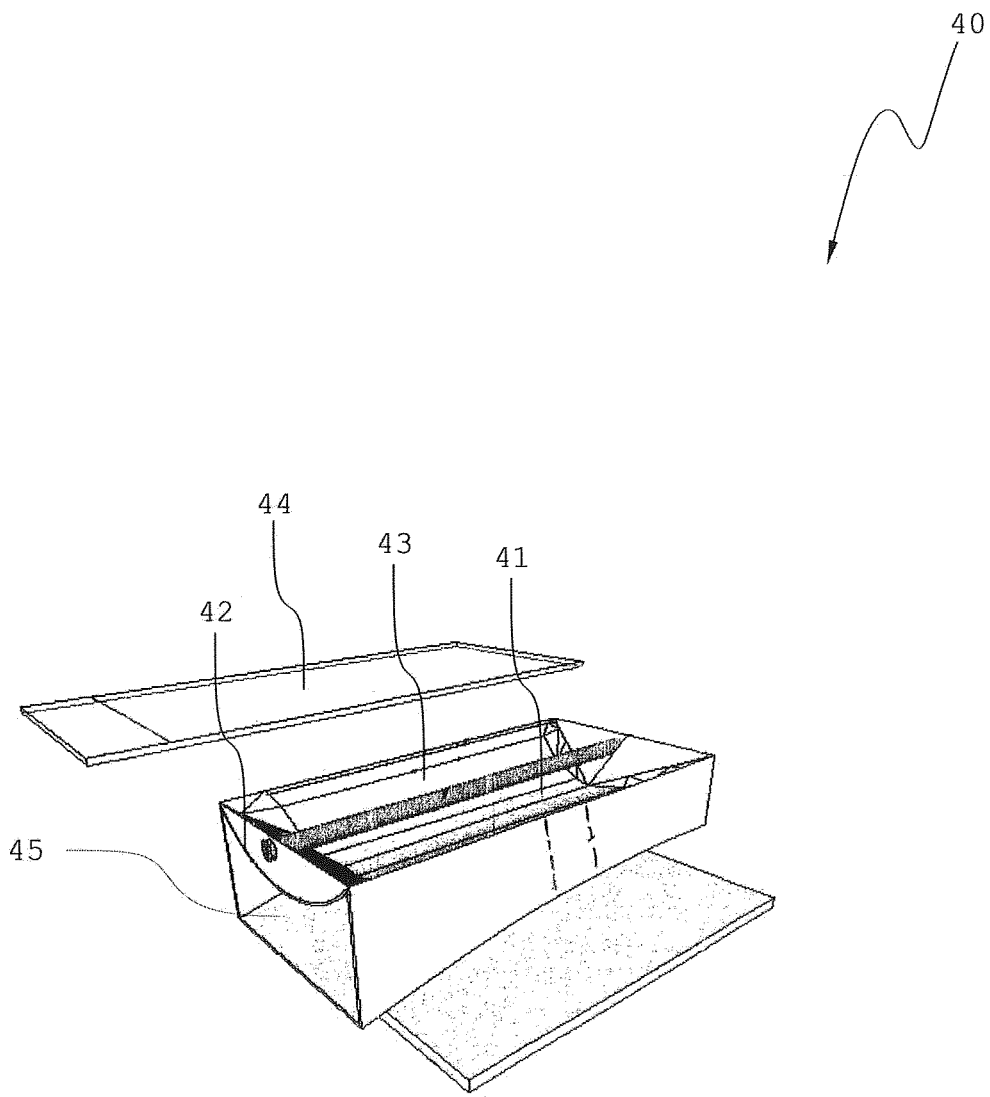
FIG. 6: is a perspective view of a second embodiment of a roof tile.

FIG. 6 shows a perspective view of a second embodiment of a roof tile. Similarly to the first embodiment, second embodiment includes a concave plate 42 with photovoltaic cells 43, which form a concave surface, mounted thereon. The concave plate 42 is protected by a cover sheet 44, which extends beyond an inlet of a wind channel 45. The second embodiment of a roof tile 1 differs from the first embodiment in that the concavity of plate 42 is oriented in a different direction. As in the first embodiment the concave surface includes a bottom 41. However, the bottom 41 extends in a direction along the direction of the wind channel 45.

Further, the second embodiment includes only a single wind channel 45 with one turbine.

Figure 7:
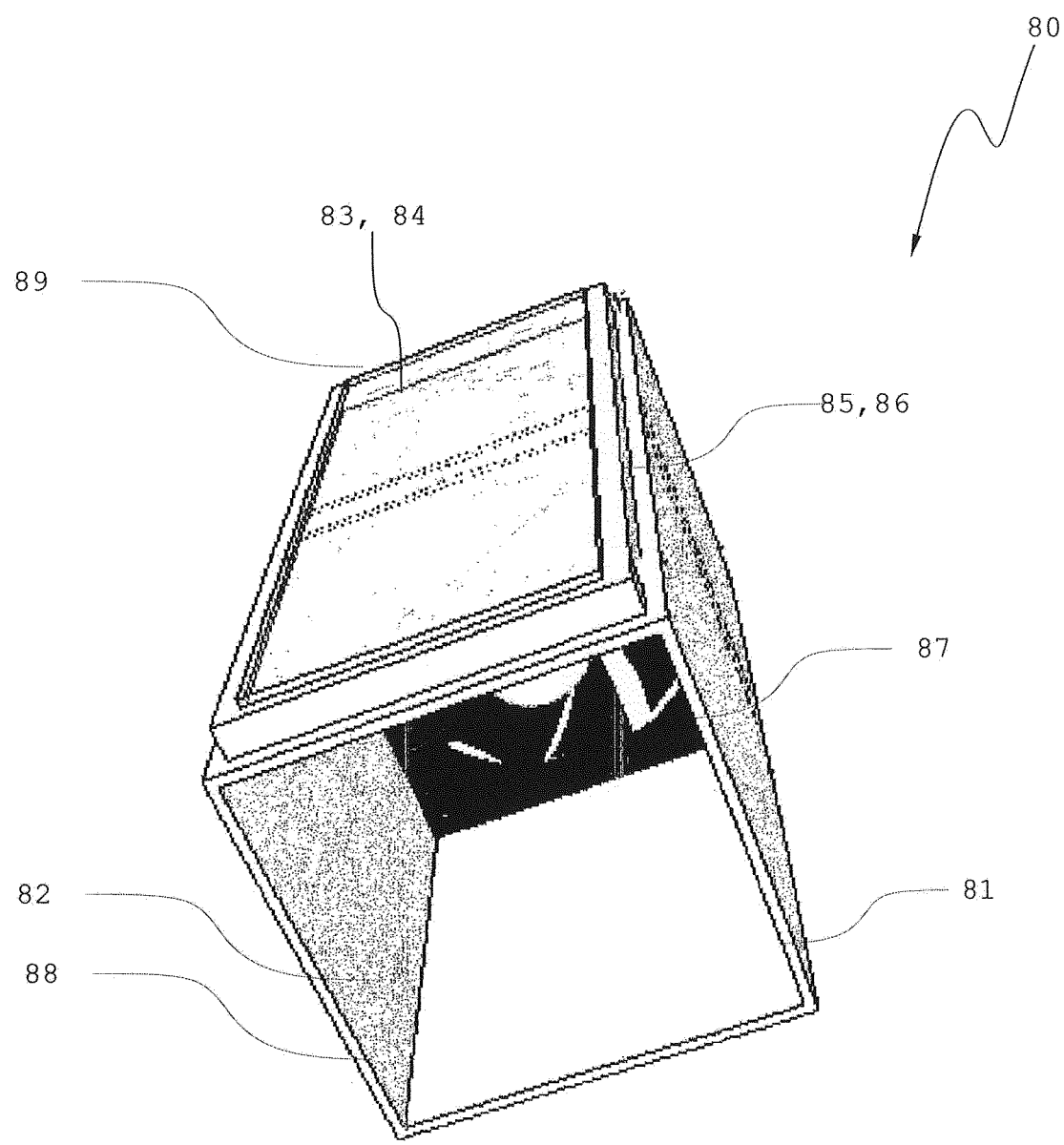
FIG. 7: is a perspective view of a third embodiment of a roof tile.

FIG. 7 shows a perspective view of a third embodiment of a roof tile 80. The third embodiment includes a wind channel 82 with a quadratic cross section. The quadratic cross section is formed by a housing 81. On a top side 83 of the housing photovoltaic cells 84 are fixed. In between the photovoltaic cells 84 and the housing 81, a thermal collector 85 is placed. In the third embodiment, thermal collector 85 is a thermoelectric generator layer 86. A wind turbine 87 is placed in between an inlet 88 and an outlet 89 of the wind channel 82.

Figure 8:
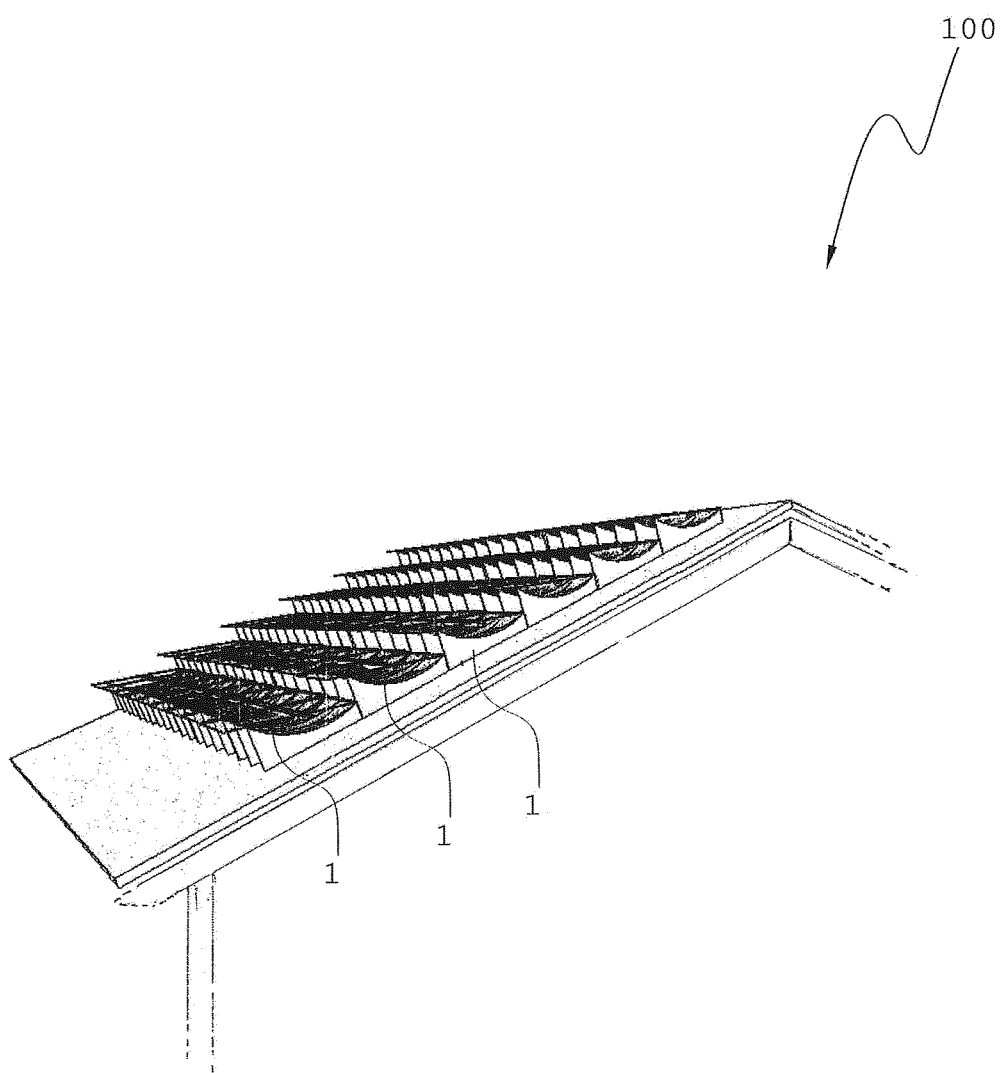
FIG. 8: is a perspective view of a building with a plurality of roof tiles mounted on a roof.
Figure 9:
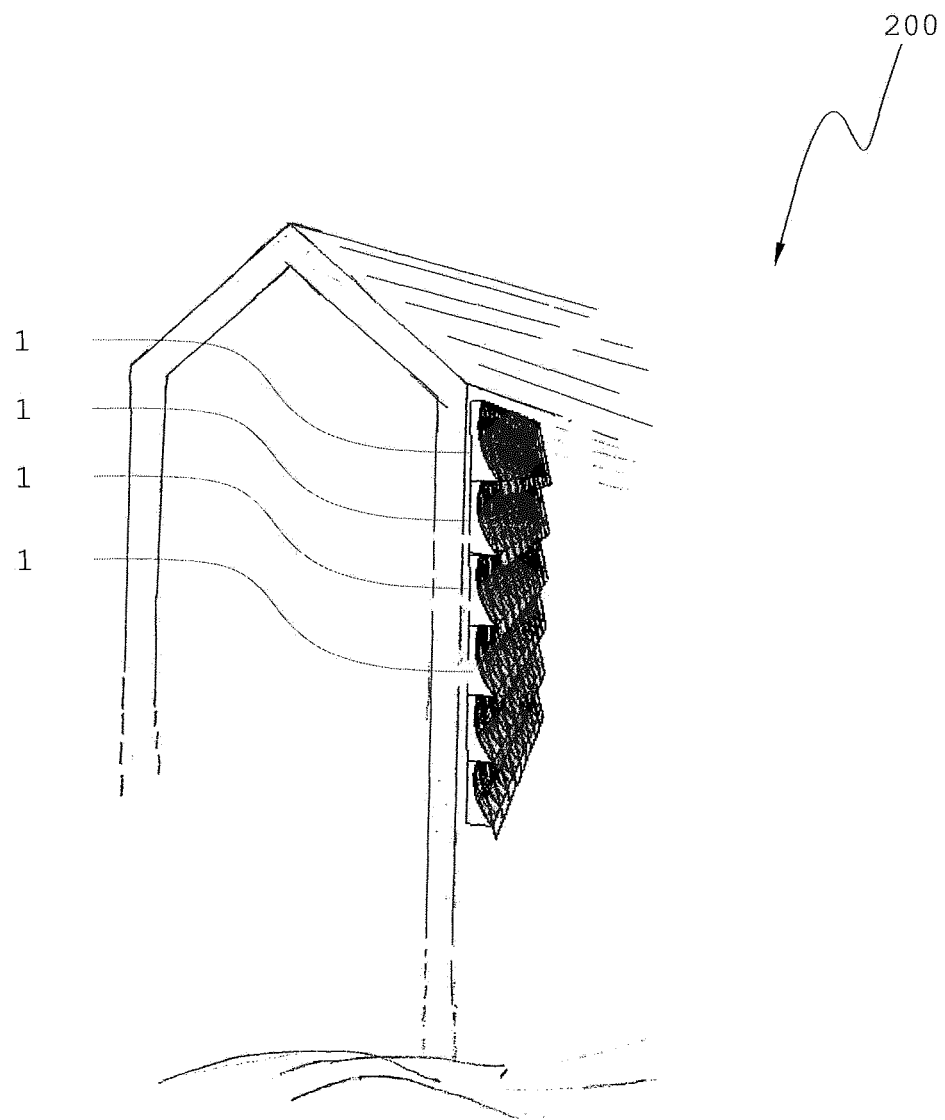
FIG. 9: is a perspective view of a building with a plurality of roof tiles mounted on a wall.

FIGS. 8 and 9 show perspective views of buildings 100 and 200 with a plurality of roof tiles 1 according to the invention. In FIG. 8 the roof tiles 1 are mounted on a roof. The roof tiles are connected to each other via electrical and fluid connectors. The heat pipe of each tile is connected to the neighbouring tile 1. As can be seen in FIG. 8, the roof tiles 1 replace conventional roof tiles and protect the roof from the environment in addition to its other functions. The roof tiles are fixed by a mechanical connection to each other and with latching elements to a batten.

On one edge the bottom sheet 24 forms a cavity. The cavity includes an opening which is smaller than the cavity. On an opposing edge the bottom sheet 24 includes a projection. The projection and the cavity are shaped complimentary such that the projection can be inserted into the cavity.

Another application of the roof tiles is shown in FIG. 9: the roof tiles 1 are mounted on a wall of a building.

Figure 10:
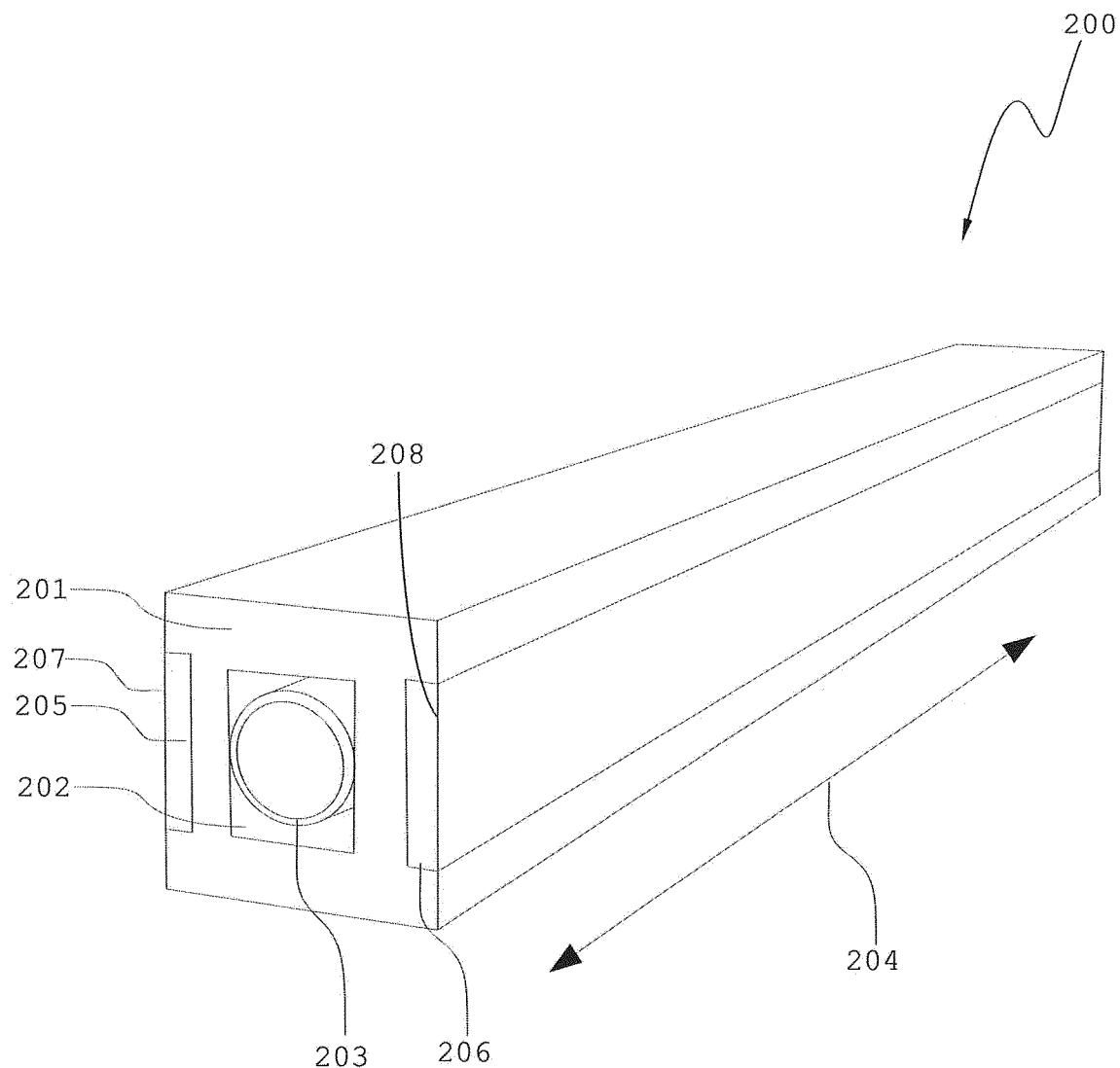
FIG. 10: is a perspective view of a batten.

FIG. 10 shows a perspective view of a batten 200. The batten 200 forms a connection between two rafters (not shown) and is a basis for an attachment of roof tiles. The batten 200 includes a housing 201 made of wood. The housing 201 includes a hollow space 202 in its center, which extends along a longitudinal direction 204 of the batten 200. A pipe 203 is disposed within the hollow space 201. The pipe 203 also extends along the longitudinal direction 204 and is protected by the housing 201. The pipe 203 transports water for a thermal collector in a roof tile.

Additionally the batten 200 includes two U-shaped recesses 205, 206 on its sides. In the recesses 205 and 206 tracks 207 and 208 for electric cables are placed. The tracks are closed, and hence protect the cables. The electric cables are electrically connected to roof tiles and transmit generated power from the roof tiles to the building. Additionally, separate electric cables in tracks 207 and 208 transmit information from the tiles to a building control center and vice versa.

The roof tiles are connected to the batten 200 with a support which is releasably attachable to the batten 200.

The support includes two angle brackets with an angle of 90 degrees and an isolation layer. The isolation layer provides a thermal barrier between the roof tile and the batten. Onto one side of a first angle bracket the isolation layer is placed. Then one side is of a second angle bracket is placed onto the isolation layer such that a U-shaped structure with two arms defining an opening results. A width of the opening is smaller towards the ends of the U shaped structure. Thus the arms of the U-shaped structure snap on the batten, when the support is slid over the batten 200. The isolation layer and one side of each angle bracket form a connecting part of the support. The connecting part includes two electrical conductors which allow an electrical connection between a tile and the batten 200.

Figure 11:
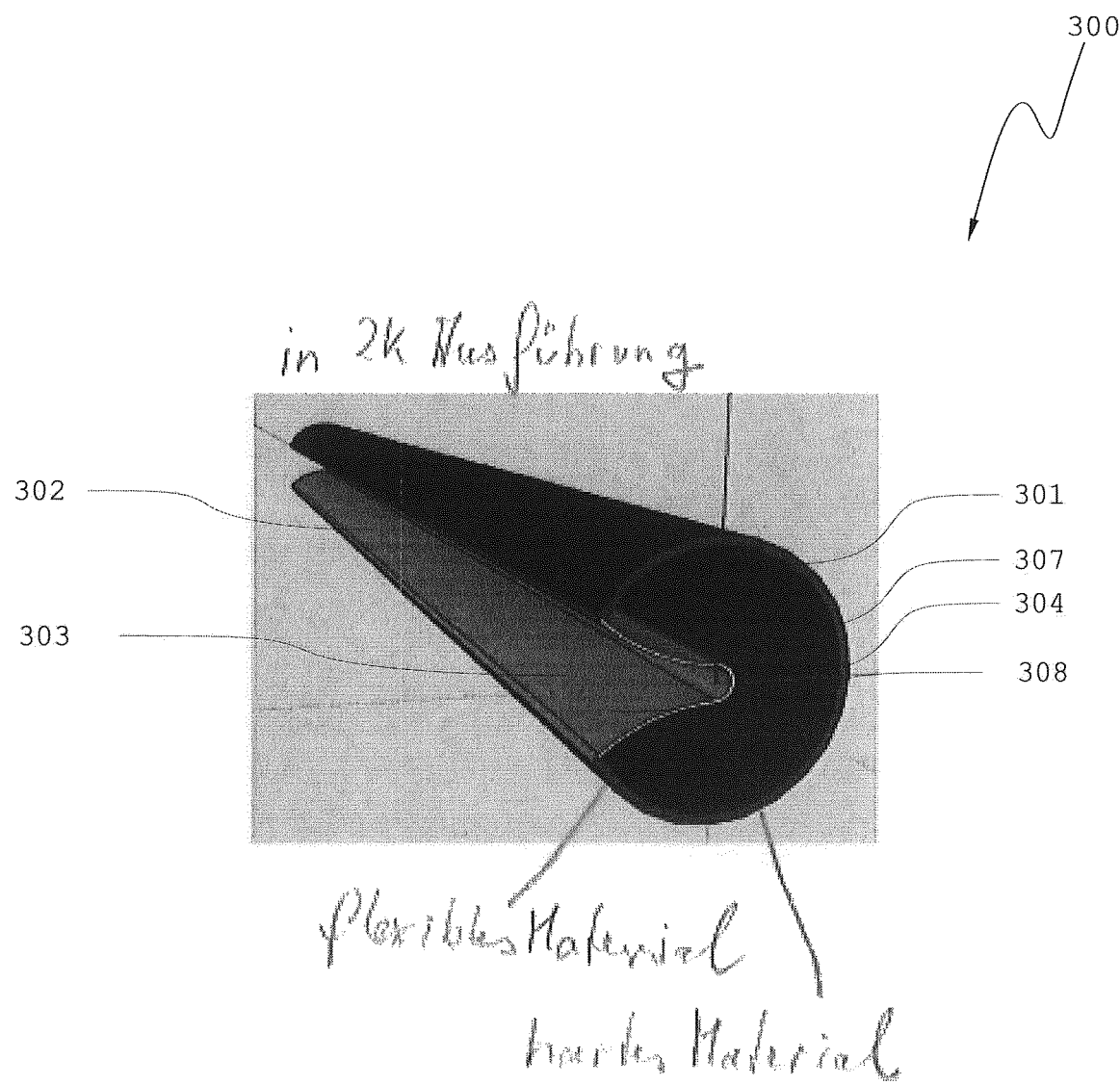
FIG. 11: is a perspective view of a pipe.

FIG. 11 shows a pipe 300. A wall of the pipe 300 is made of two wall sections 301, 302. The first section 301 is a rigid, C-shaped circumferential wall section. The first section 301 is made of a metal and includes an electrical connection to a lightning rod of a building. An open end 303 of the C-shaped first section is closed by the second part 302. The second section 302 is made of a deformable, elastic material like plastic. A cross-section of a first section is circular around a center 304 of the pipe 300. The second section 302 extends towards the center 304 and forms a cavity realized as V-shaped depression 308. The pipe 300 transports water in its bore 307.

A head 305 of neat pipe 306 is inserted in the depression. The head 305 of the heat pipe pushes the deformable second wall section 302 into the water in the bore 307. A pressure of the water in the bore and the elasticity of the second wall section then push the second wall section tightly against the head 305 of the heat pipe. After all heat pipe heads are inserted into the V-shaped depression 308, the V-shaped depression 308 is filled up with foam.

The pipe includes latching elements (not shown) which retain the heat pipe in its position. Further the pipe includes jets (not shown). The jets are directed towards a roof of a building or towards cover sheets of roof tiles.

The invention claimed is:

1. A tile for collecting energy from at least one of kinetic, thermal and light sources, the tile comprising:
    a housing with
        at least one photovoltaic cell for collecting energy from a light source, and
        at least one thermal collector;
    wherein the tile comprises at least one wind channel with a wind turbine; and
    a cover sheet that extends beyond a side of the wind channel having at least one inlet.

2. The tile according to claim 1, wherein the wind channel comprises the at least one inlet and at least one outlet.

3. The tile according to claim 1, wherein the tile comprises a concave surface.

4. The tile according to claim 1, wherein the housing comprises a concave plate limiting the wind channel.

5. The tile according to claim 3, wherein the concave surface comprises a bottom extending in a direction of the wind channel or orthogonal to the direction of the wind channel.

6. The tile according to claim 1, wherein the at least one thermal collector is placed between the at least one photovoltaic cell and the at least one wind channel or within the at least one wind channel.

7. The tile according to claim 1, wherein the tile comprises a thermoelectric generator layer adjacent to the at least one photovoltaic cell.

8. The tile according to claim 1, wherein the tile is a roof tile.

9. The tile according to claim 1, wherein an inlet cross-sectional area and an outlet cross-sectional area are larger than a cross sectional area of the wind channel in between the at least one inlet and at least one outlet.

10. The tile according to claim 1, wherein the cover sheet is transparent.

11. A plurality of tiles according to claim 1, wherein the plurality of tiles are installed on one of a roof, a wall, a shaft, a tower, a soil surface, on water or on sails or surfaces which are flexible or moving surfaces.

12. A building comprising a plurality of tiles according to claim 1.

13. A batten for fixation of tiles,
the batten comprising a pipe for transporting water and a track for electric wiring, the electric wiring comprising least one first interface allowing an electrical connection to a tile which collects energy from at least one of kinetic, thermal and light sources,
wherein the pipe comprises at least one second interface for the tile allowing a fluidic connection and the tile comprises a third mechanical interface allowing fixation of the tile, and
the tile having:
a housing with at least one photovoltaic cell for collecting energy from a light source, and at least one thermal collector,
at least one wind channel with a wind turbine, and
a cover sheet that extends beyond a side of the wind channel having at least one inlet.

14. The batten according to claim 13, wherein the batten is a roof batten.

15. A pipe for transporting a fluid having a cross-section orthogonal to an intended flow direction of the fluid with a wall comprising a deformable circumferential first wall section and a rigid circumferential second wall section,
wherein the first wall section is at least partially made of a thermally conductive material,
the pipe being connected to a tile for collecting eneray from at least one of kinetic, thermal and light sources,
the tile comprising:
a housing with
at least one photovoltaic cell for collecting energy from a light source, and
at least one thermal collector:
wherein the tile comprises at least one wind channel with a wind turbine; and
a cover sheet that extends beyond a side of the wind channel having at least one inlet.

16. The pipe according to claim 15, wherein the second wall section extends towards a center of the pipe forming a cavity which is formed by an outer edge of the second wall section.

17. The pipe according to claim 15, wherein the first wall section and the second wall section are integrally formed with one another.

18. The pipe according to claim 15, wherein the pipe is electrically conductive and includes an electrical interface.

19. A system including:
a pipe according to claim 15, and
a nozzle which is directable to a roof.

20. A method of producing a pipe, including the steps of:
providing a deformable first section and a rigid second section,
joining the first and the second sections at a first edge, and
joining the first and the second sections at a second edge,
connecting the pipe to a tile for collecting energy from at least one of kinetic, thermal and light sources, the tile comprising:
a housing with
at least one photovoltaic cell for collecting energy from a light source, and
at least one thermal collector:
wherein the tile comprises at least one wind channel with a wind turbine; and
a cover sheet that extends beyond a side of the wind channel having at least one inlet.

* * * * *